(12) United States Patent
Wappling

(10) Patent No.: US 6,373,242 B1
(45) Date of Patent: Apr. 16, 2002

(54) GMR SENSOR WITH A VARYING NUMBER OF GMR LAYERS

(75) Inventor: Roger Wappling, Uppsala (SE)

(73) Assignee: Forskarpatent I Uppsala AB, Uppsala (SE)

( * ) Notice: Subject to any disclaimer, the term of this patent is extended or adjusted under 35 U.S.C. 154(b) by 0 days.

(21) Appl. No.: 09/623,704

(22) PCT Filed: Dec. 9, 1999

(86) PCT No.: PCT/SE99/02303

§ 371 Date: Sep. 7, 2000

§ 102(e) Date: Sep. 7, 2000

(87) PCT Pub. No.: WO00/40987

PCT Pub. Date: Jul. 13, 2000

(51) Int. Cl.[7] ............................ G01B 7/14; G01R 33/09; H01L 43/08
(52) U.S. Cl. ............................ 324/207.21; 324/207.24; 324/252; 338/32 R
(58) Field of Search .................. 324/207.21, 207.24, 324/207.25, 252; 338/32 R

(56) References Cited

U.S. PATENT DOCUMENTS

| | | | | |
|---|---|---|---|---|
| 3,335,384 A | * | 8/1967 | Weiss | |
| 3,691,502 A | * | 9/1972 | Kataoka | ............ 324/207.21 X |
| 4,835,509 A | * | 5/1989 | Yoshino et al. | ........... 338/32 R |
| 5,475,304 A | * | 12/1995 | Prinz | ..................... 324/207.21 |
| 5,627,466 A | * | 5/1997 | Spies et al. | ............ 324/207.21 |
| 6,154,025 A | * | 11/2000 | Schelter et al. | ......... 324/252 X |
| 6,222,361 B1 | * | 4/2001 | Shimano et al. | ........ 324/252 X |

* cited by examiner

Primary Examiner—Gerard R. Strecker
(74) Attorney, Agent, or Firm—Young & Thompson

(57) ABSTRACT

A position sensor for non-contact position measurement includes a sensor magnet and a sensor body. The sensor body is formed from a magneto-resistive material and is given a two or three dimensional geometrical shape to achieve a desired sensitivity function. The desired sensitivity function results from a variation in one or more of the sensor body dimensions. By forming the sensor body of magneto-resistive material into different geometrical shapes like a simple wedge, a double wedge, a circular tapered form or an arbitrary shape, a desired sensitivity function is obtained.

4 Claims, 3 Drawing Sheets

GMR SENSOR WITH A VARYING NUMBER OF GMR LAYERS

TECHNICAL FIELD

The present invention relates to tailoring the shape of a magneto-resistive material, and more particularly to a design of the shape of the magneto-resistive material to obtain a new type of position sensitive sensor.

BACKGROUND

The position of a moving object is often determined by means of the readout from a resistive sensor, usually of potentiometer type, which is mechanically connected to the object to be monitored.

In order to reduce the wear and thereby crease e reliability, it is desirable to eliminate the sliding friction encountered in the standard resistive sensors. Non-contact methods using e.g. inductively coupled coils is currently being introduced as replacement for the potentiometer sensors. However, these are more complex and therefore more expensive.

In recent years novel types of magneto-resistive materials with much higher sensitivity to moderate changes in magnetic fields have been found. These new materials showing giant magneto-resistance (GMR) or colossal magneto-resistance (CMR) make possible new types of position sensors.

In a document U.S. Pat. No. 5,475,304 is disclosed a giant magneto-resistant sensor including at least one layered structure. The layered structure includes a ferromagnetic layer having a fixed magnetic state, a second, softer magnetic layer, and a metal layer interposed between and contacting these two layers. The sensor also includes one or more indexing magnets for inducing a domain wall, at a measured position, between regions of nonaligned magnetic fields in the softer magnetic layer. By measuring the resistance across the magneto-resistant sensor a displacement of one workpiece, carrying the sensor, will be measured relative to another workpiece carrying an inducing means.

Yet another document U.S. Pat. No. 5,627,466 discloses a position measuring device having a sensor, the output signal of which is a function of the distance between a graduation and a scanning unit. Magneto-resistive elements, which scan the graduation, are disposed in the active branch of a potentiometer circuit. The voltage over the active branch is taken as the distance-dependent signal and is used to control the amplitude of the position-dependent scanning signals generated by scanning the graduation.

However, there is still a demand for non-contact sensor devices for position measurement offering a sensitivity function adapted to the particular application.

SUMMARY

The object of present invention is to disclose a device, which forms a position sensor for non-contact position measurement The device comprises a sensor magnet and a sensor body made of a magneto-resistive material, whereby the magneto-resistive material is formed into a body having two or three dimensional geometrical shape to achieve a desired sensitivity function. The desired sensitivity function then results from a variation in one or more of the sensor body dimensions.

According to the object of the present invention the sensor body presents in different embodiments shapes like a simple wedge, a double wedge, a circular tapered form or an arbitrary shape to obtain the desired sensitivity function.

BRIEF DESCRIPTION OF THE DRAWINGS

The invention, together with further objects and advantages thereof, may best be understood by making reference to the following description taken together with the accompanying drawings, in which.

DETAILED DESCRIPTION

Theory

Figure 1:
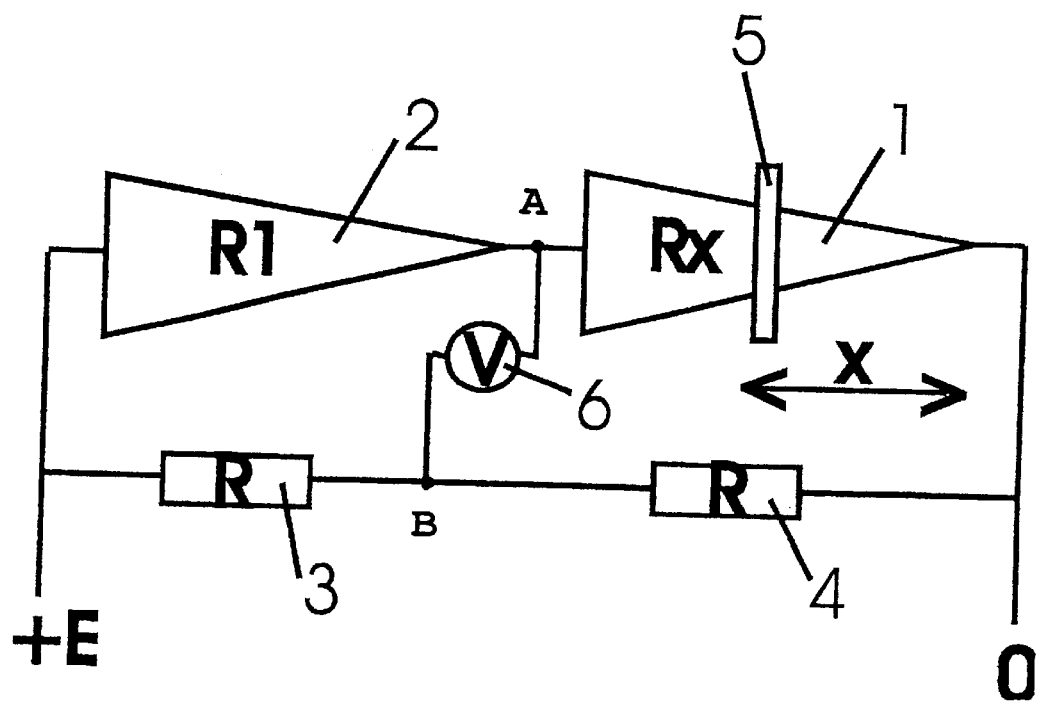
FIG. 1 illustrates a basic circuit diagram for measuring the change of the resistance in a position sensitive sensor made from a magneto-resistive material.

The electric resistance of a segment of length $\Delta l$ and an average area A made up of a material with resistivity $\rho$ is given by $$\Delta R = \rho \frac{\Delta l}{A}$$

If a magnetic field is applied over this segment the resistance changes by the amount $$\delta \Delta R = \delta \rho \frac{\Delta l}{A}$$

the magnitude of this change depends on the material in question and is for GMR materials typically some tens of percent while for CMR much higher values can be obtained in limited temperature ranges. For a conductor of constant cross-section the change is independent of position but if A is a function of position, unique position information can be obtained. The above described sensitivity to position is utilized for instance in a Wheatstone type bridge circuitry consisting of two identical standard resistors R and one (or two) magneto-resistive elements $R_1$ and $R_x = R1 - \delta \Delta R$. If one of the magneto-resistive elements is exposed to a magnetic field over the distance $\Delta l$ at position x, the resistance of this element changes by $$\delta \Delta R = \delta \rho \frac{\Delta l}{A(x)}$$

as a consequence, the voltage between the connecting points A and B (FIG. 1), $V_{AB}$, changes from an initial value of zero to $$V_{AB} = -\frac{E}{4} \frac{\delta \Delta R}{R - \delta \Delta R}$$

For small $\delta\Delta R$ this changes to $$V_{AB} = -\frac{E}{4}\frac{\delta\Delta R}{R}$$

and the voltage difference is then directly related to the position.

$$V_{AB} = -\frac{E}{4R}\delta\rho\frac{\Delta l}{A(x)}$$

Description of an Illustrative Embodiment

In an illustrative embodiment for a GMR-based system the magneto-resistive material consists of a Co/Cu multi-layer prepared by sputtering on a glass or silicon substrate with a thickness of the layers of the order of 1 nm and chosen such that an anti-ferromagnetic ordering is obtained between consecutive magnetic layers. The number of repetitions is some tens and the multi-layer structure is protected by a 1 nm thick coating layer of tantalum. This material is formed in the appropriate shape to achieve the desired sensitivity function either by masking during deposition or by cutting or etching after deposition. The sensitivity function is the result of a variation of one or two dimensions as displayed for a different geometry in FIGS. 2–5.

The obtained magneto-resistive material (the sensing element) is mounted fixed onto a holder and a small moving permanent magnet, rigidly connected to the moving object, the position of which is to be determined, is positioned close to the sensing element so that part of the sensor material is exposed to the magnetic field. The magnitude of the field from the permanent magnet is sufficiently large so that the exposed part of the sensing element is driven into the ferromagnetic state resulting in a (local) resistance change of the order of 20–50%. This change in resistance is measured directly or through the resulting asymmetry in a Wheatstone type bridge.

FIG. 1 illustrates a typical circuit diagram forming a bridge for measuring the change in resistance of a position sensor element 1 utilizing a magneto-resistive material. The sensor element 1 of a resistance Rx and a resistor 4 having a fixed value R form a first branch and a resistor 2 having a fixed value R1 and a resistor 3 having the fixed value R constitute the second branch of the bridge. The resistance R1 corresponds to the nominal resistance of the sensor element 1 and preferably having a temperature dependency corresponding to the temperature dependency of the sensor element 1. In a typical embodiment a permanent magnet 5 is placed close to the sensor element 1 such that the magnet and the element 1 may be displaced in relation to each other in a x-direction indicated by the double arrow. One terminal of a voltmeter 6 is connected to the connection point between Rx and R1. The other terminal of the voltmeter 6 is connected to the connection point between resistors 3 and 4. The voltmeter measures voltage differences achieved by the two voltage dividers formed by the two branches, which are supplied by a voltage source E. Thus, a change in the voltage difference displayed by the voltmeter 6 will be a function of a variation of the resistance 1, which in turn is a function of a motion x of the magnet 5.

$$R_x = R_1 - \partial R;\ \partial R = f(x) \rightarrow V = V(x)$$

The area where the magnetic field acts is indicated by the reference numeral 5 in FIG. 1. The element R1 and Rx may even be made as identical elements. However in most cases R1 will be replaced by a suitable standard metal film resistor. Furthermore the shape of the sensor material is varied to accommodate the specific sensitivity function desired.

Consequently the magneto-restive material is formed into an arbitrary shape to achieve the desired sensitivity function. The sensitivity function may primarily be the result of a variation in one dimension, e.g. the width of a strip of material as visualized by the form of Rx in FIG. 1. This is then accomplished by using a any type of magneto-resistive material where the constant thickness represents a multi layer structure having the thickness of the layer chosen such that an anti-ferromagnetic ordering is obtained between consecutive magnetic layers.

Figure 2:
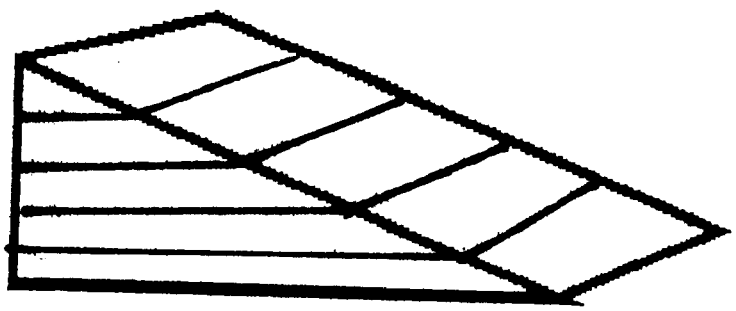
FIG. 2 illustrates an embodiment with a basic wedge shape for a position sensitive sensor made from a magneto-resistive material.
Figure 3:
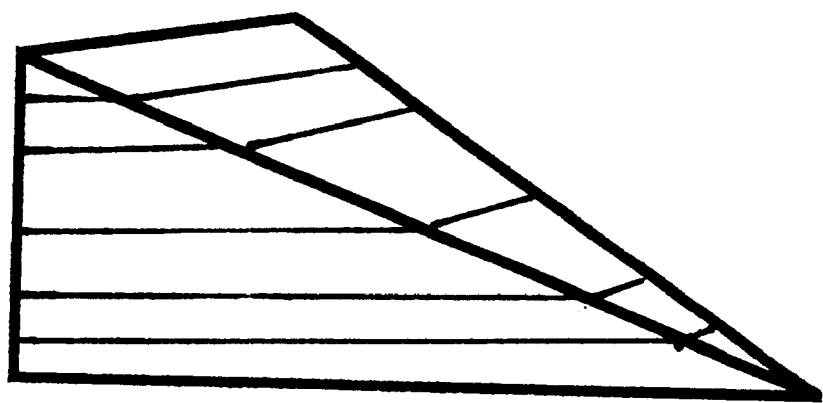
FIG. 3 illustrates an embodiment having a double wedge shape for a position sensitive sensor made from a magneto-resistive material.

According to the present improvement one dimension (width) or two dimensions (width and thickness) are varied, as is displayed in FIGS. 2 and 3, respectively, where the number of repetitions of the layers is varied while preserving the anti-ferromagnetic ordering, so that a stepwise change is superimposed on the signal corresponding to the simple wedge demonstrated in FIG. 2.

Figure 4:
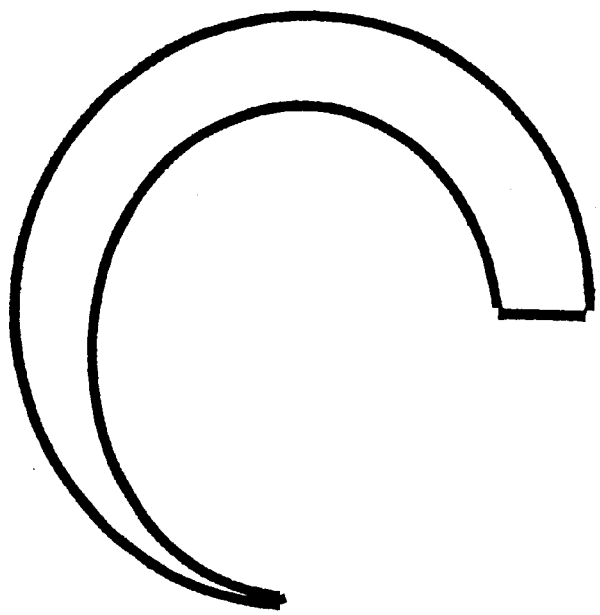
FIG. 4 illustrates an embodiment having a circular shape for a position sensitive sensor made from a magneto-resistive material.
Figure 5:
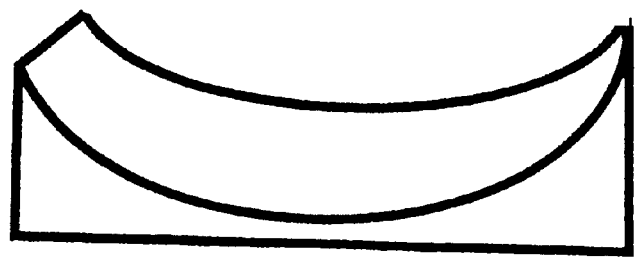
FIG. 5 illustrates an embodiment having an arbitrary shape for a position sensitive sensor made from a magneto-resistive material

In FIGS. 4 and 5 further embodiments of the position sensitive sensor are displayed. A small moving magnet, rigidly connected to the moving object the position of which is to be determined, is positioned close to the magneto-resistive material so that part of the magneto-resistive material is exposed to the field and driven into the ferromagnetic state resulting in a resistance change.

It will be understood by those skilled in the art that various modifications and changes may be made to the present invention without departure from the scope thereof, which is defined by the appended claims.

What is claimed is:

1. A position sensor for non-contact position measurement, the sensor comprising:

a sensor body made of a giant magneto-resistance (GMR) material with plural layers, said sensor body having a cross-sectional area and a number of said plural layers that vary as a function of lengthwise distance along said sensor body to provide a desired sensitivity function; and a sensor magnet adjacent to said sensor body and whose position relative to the lengthwise distance along said sensor body defines an electrical resistance of said sensor body, said sensor magnet being relatively movable lengthwise along said sensor body to change the resistance.

2. The position sensor of claim 1, wherein the cross-sectional area and the number of said plural layers vary due to a change in width of said sensor body as a function of length.

3. The position sensor of claim 1, wherein the cross-sectional area and the number of said plural layers vary due to a change in both width and thickness of said sensor body as a function of length.

4. The position sensor of claim 1, further comprising, first and second fixed resistance resistors connected in series, a third resistor connected in series with said sensor body, said third resistor having a resistance that corresponds to a nominal resistance of said sensor body, the series connection of said first and second resistors being connected in parallel to the series connection of said third resistor and said sensor body and to a source of electrical power, and a voltmeter connected between a first node between said first and second resistors and a second node between said third resistor and said sensor body, wherein a voltage measured by said voltmeter indicates a position of said sensor magnet.

* * * * *

UNITED STATES PATENT AND TRADEMARK OFFICE
CERTIFICATE OF CORRECTION

PATENT NO. : 6,373,242 B1
DATED : April 16, 2002
INVENTOR(S) : Roger Wappling

It is certified that error appears in the above-identified patent and that said Letters Patent is hereby corrected as shown below:

<u>Title page,</u>
Item [30], Insert as follows:

-- (30)     Foreign Application Priority Data

January 7, 1999     [SE]     Sweden......................... 9900015-0 --.

Signed and Sealed this

Fourth Day of June, 2002

Attest:

JAMES E. ROGAN
Attesting Officer      Director of the United States Patent and Trademark Office